(12) United States Patent
Mair et al.

(10) Patent No.: US 7,498,870 B2
(45) Date of Patent: *Mar. 3, 2009

(54) ADAPTIVE VOLTAGE CONTROL FOR PERFORMANCE AND ENERGY OPTIMIZATION

(75) Inventors: Hugh T. Mair, Fairview, TX (US); Gordon Gammie, Plano, TX (US); Alice Wang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/045,222

(22) Filed: Jan. 28, 2005

(65) Prior Publication Data

US 2005/0194592 A1 Sep. 8, 2005

Related U.S. Application Data

(60) Provisional application No. 60/550,453, filed on Mar. 4, 2004.

(51) Int. Cl.
*G05F 1/575* (2006.01)
(52) U.S. Cl. .................... 327/544; 327/540; 700/298
(58) Field of Classification Search .................. None
See application file for complete search history.

(56) References Cited

U.S. PATENT DOCUMENTS

| 5,812,860 | A  | * | 9/1998 | Horden et al. ............. 713/322 |
| 6,657,467 | B2 |   | 12/2003 | Seki et al. |
| 7,023,261 | B2 | * | 4/2006 | Mano et al. ................. 327/541 |
| 7,061,292 | B2 | * | 6/2006 | Maksimovic et al. ....... 327/277 |
| 2005/0004718 | A1 | * | 1/2005 | Issa et al. .................... 700/304 |
| 2005/0062507 | A1 | * | 3/2005 | Naffziger et al. ............ 327/105 |
| 2006/0091385 | A1 | * | 5/2006 | Mair et al. .................... 257/49 |

* cited by examiner

*Primary Examiner*—Lincoln Donovan
*Assistant Examiner*—Terry L Englund
(74) *Attorney, Agent, or Firm*—Ronald O. Neerings; Wade James Brady, III; Frederick J. Telecky, Jr.

(57) ABSTRACT

A device for adaptively controlling a voltage supplied to circuitry in substantially close proximity to the device, comprising a processing module, a first tracking element coupled to the processing module and producing a first value indicative of a first estimated speed associated with the circuitry, and a second tracking element coupled to the processing module and producing a second value indicative of a second estimated speed associated with the circuitry. The processing module compares each of the first and second values to a target value and causes a voltage output to be adjusted based on said comparison.

38 Claims, 3 Drawing Sheets

US 7,498,870 B2

ADAPTIVE VOLTAGE CONTROL FOR PERFORMANCE AND ENERGY OPTIMIZATION

CROSS-REFERENCE TO RELATED APPLICATIONS

This application claims priority to U.S. Provisional Application No. 60/550,453, filed Mar. 4, 2004 and entitled "Simplified SmartReflex for Performance and Energy Optimization," incorporated herein by reference.

BACKGROUND

A load (e.g., a chip) may comprise a plurality of circuit paths. A "circuit path" may be interpreted to mean arrangements of electronic circuitry through which current may flow. Each path generally comprises a plurality of transistors. In some cases, each path may be designed to perform a specific function. One of these paths may be the most poorly-performing (i.e., slowest) path, due to any of a variety of reasons, such as circuit complexity. The circuit path that limits the overall performance frequency of other circuit paths and/or the load itself may be termed the "critical path."

Any of a variety of factors, such as temperature, voltage, manufacturing variation and other factors not specifically disclosed herein may affect the speed of the critical path, as well as that of any of the other circuit paths. For example, because the voltage supplied to a circuit path is applied to some or all of the transistors in the circuit path, the voltage dictates, at least in part, the performance of the transistors in the path. In turn, the performance of the transistors dictates, at least in part, the speed of the circuit path itself. Thus, if a voltage that is delivered to a circuit path is undesirably high or low (i.e., the voltage has been substantially altered by various circuit components and phenomena between a voltage source and the circuit path), the performance speed of the circuit path may likewise be undesirably high or low.

In some cases, such factors may impact the speed of the critical path and/or another path such that the speed of the path may become excessively low or excessively high. If the speed becomes excessively low, the path and/or the load may cease to function. Conversely, if the speed becomes excessively high, the chip and/or the load may waste power or even become damaged.

SUMMARY

The problems noted above are solved in large part by a method and apparatus of adaptive voltage control for performance and energy optimization. At least one embodiment may be a device for adaptively controlling a voltage supplied to circuitry in substantially close proximity to the device, comprising a processing module, a first tracking element coupled to the processing module and producing a first value indicative of a first estimated speed associated with the circuitry, and a second tracking element coupled to the processing module and producing a second value indicative of a second estimated speed associated with the circuitry. The processing module compares each of the first and second values to a target value and causes a voltage output to be adjusted based on the comparison.

Another embodiment may be a chip having a circuit comprising a plurality of circuit paths and receiving voltage from a voltage source. The chip may further comprise a module external to the circuit, coupled to the voltage source, and comprising a first tracking element and a second tracking element, the module subjected to substantially similar operating conditions as the circuit. The module adjusts a voltage source output based on a value generated by at least one of the first and second tracking elements.

Yet another embodiment may be a method comprising determining a first frequency ratio of a first tracking element frequency to a first target reference frequency, determining a second frequency ratio of a second tracking element frequency to a second target reference frequency, and, based on the frequency ratios, adjusting the voltage that is output by a voltage source to a circuit associated with the tracking elements.

Still another embodiment may be a system comprising a processing module, a voltage source coupled to the processing module, and a plurality of tracking elements coupled to the processing module and the voltage source and associated with circuitry separate from the tracking elements, a value generated by each element indicative of the performance speed of at least a portion of the circuitry. The processing module adjusts the voltage source output based on a comparison of the value of a tracking element to a desired value.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a "reflex" module that may be implemented within any chip (i.e., load) or circuit system to compensate for at least one of the various factors that adversely affect the speed of a circuit path (e.g., critical path) on the chip. By compensating for these factors, the reflex module enables the circuit path (and thus the chip) to maintain a predetermined speed of operation, or at least maintain the speed within a desired range. For instance, the reflex module may react to a change in ambient temperature. Recognizing that a change in ambient temperature may potentially cause the speed of a circuit path such as the critical path to be altered to an undesirable level, the reflex module may adjust the voltage supply accordingly. In this way, a desirable circuit path speed is maintained and the chip is prevented from consuming excess power and/or from suffering a loss in performance. The reflex module preferably is not application-specific. As such, the reflex module may be considered generic and may be used within any circuit architecture without a need for substantial modification.

Figure 1:
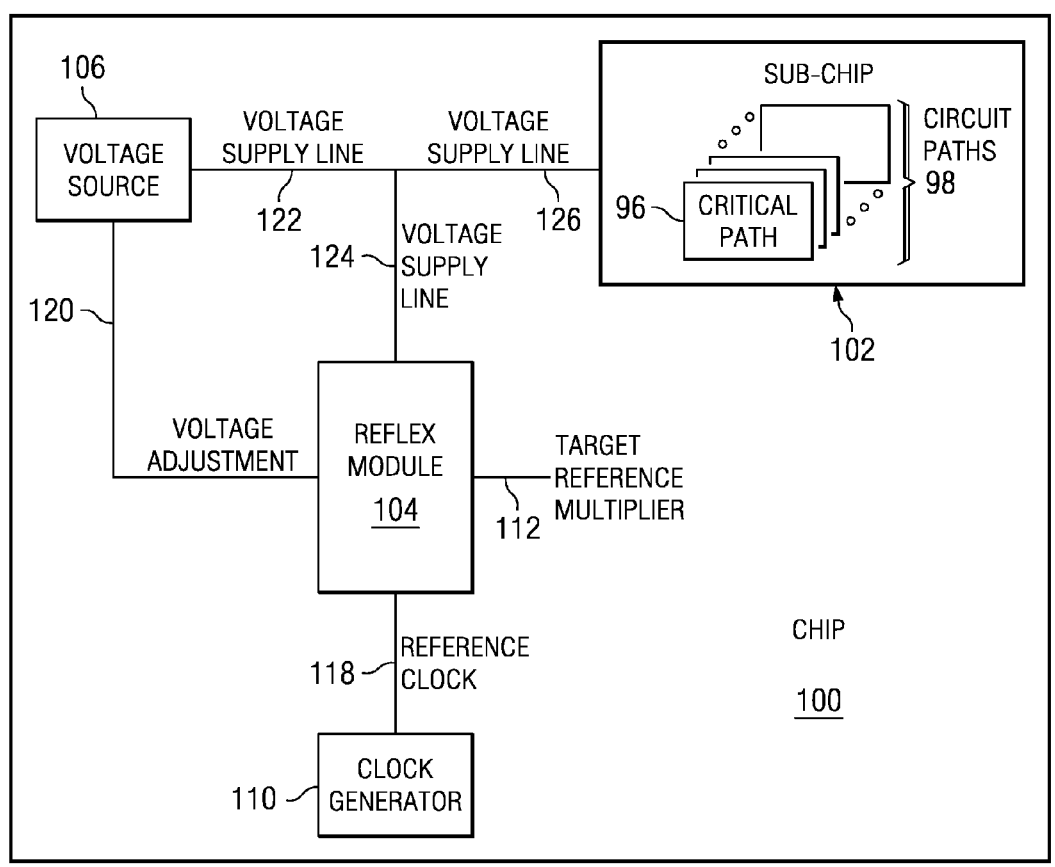
FIG. 1 shows a block diagram of a chip having a voltage source, a sub-chip comprising multiple circuit paths, one of which is a critical path, and a "reflex" module, wherein the reflex module adaptively controls the voltage supplied to the sub-chip, in accordance with a preferred embodiment of the invention.

FIG. 1 shows an exemplary embodiment of a chip 100 comprising such a reflex module. Specifically, in at least some embodiments, the chip 100 comprises a voltage source 106, a "sub-chip" 102 comprising circuit paths 98, a reflex module 104 and a clock generator 110. The voltage source 106 and the clock generator 110 are not necessarily located on the chip 100. The sub-chip 102 may be any portion of the circuitry of the chip 100 and may perform some specific function. The sub-chip 102 also may be a chip that is separate from the chip 100, wherein the sub-chip 102 is stacked upon the chip 100. The circuit paths 98 preferably comprise a critical path 96 of the sub-chip 102. The circuit paths 98 also may comprise any other path of circuitry on the sub-chip 102. The circuit paths 98, including the critical path 96, may comprise a plurality of transistors arranged in a predetermined format. The voltage source 106 supplies voltage to the sub-chip 102 by way of voltage supply lines 122, 126 and to the reflex module 104 by way of voltage supply lines 122, 124. The reflex module adaptively controls the voltage output of the voltage source 106 by sending signals to the voltage source 106 via voltage adjustment 120. The clock generator 110 supplies to the reflex module 104 a reference clock signal 118. The reflex module 104 also is supplied with a target reference multiplier (TRM) signal 112, which is used as described further below.

The TRM 112 may be a value selected by a manufacturer or some other entity. The TRM 112 is used by the reflex module 104 to estimate whether one of the circuit paths 98, preferably the critical path 96, is performing at an acceptable speed. More specifically, in at least some embodiments, the TRM 112 is multiplied by the reference clock 118 frequency to produce a target reference frequency (TRF) 113 (not shown). The reflex module 104 uses the TRF 113 to determine whether the critical path 96 is performing at an acceptable speed. If it is determined that the circuit path 98 of concern is currently or may soon be performing at an undesirably high or low speed (i.e., in relation to the TRF 113), then the reflex module 104 may adjust the voltage output of the voltage source 106 accordingly. This may be accomplished by reducing voltage output if the circuit path(s) 98 is performing at too high a speed or increasing voltage output if the circuit path(s) 98 is performing at too low a speed. By adjusting the voltage supplied to the circuit paths 98, some or all of the circuit paths 98 (e.g., critical path 96) may be manipulated to perform at a speed closer to a desired speed (e.g., the speed of the TRF 113). Thus, the TRM 112 (effectively the TRF 113) may be assigned a value as desired and may be used to deliberately increase or decrease the speed of the circuit path 98 (e.g., critical path 96), thus boosting performance of the circuit path(s) 98, the sub-chip 102 and/or the chip 100, or diminishing power consumption by the circuit path(s) 98, the sub-chip 102 and/or the chip 100. Although only one TRM 112 is shown, any number of TRMs may be used.

For example, in cases where excessive power consumption is a substantial concern, the TRM 112 may be assigned a considerably low value. The reflex module 104 may multiply the TRM 112 by the reference clock 118 frequency to produce a TRF 113. The reflex module 104 then may essentially compare the TRF 113 against the speed at which the critical path 96 (or any circuit path 98) may be performing, although such comparison is not a direct comparison, as described in context of FIG. 2 below. If the critical path 96 is surmised to be performing at a speed higher than the TRF 113, the reflex module 104 may cause the voltage supplied to the critical path 96 by the voltage source 106 to be decreased. Because the voltage supplied to the critical path 96 is decreased, the speed at which the critical path 96 performs also is decreased, preferably to the TRF 113 or within some predetermined range including the TRF 113. The precise technique used by the reflex module 104 to surmise the speed of the critical path 96 is described in detail below.

Figure 2:
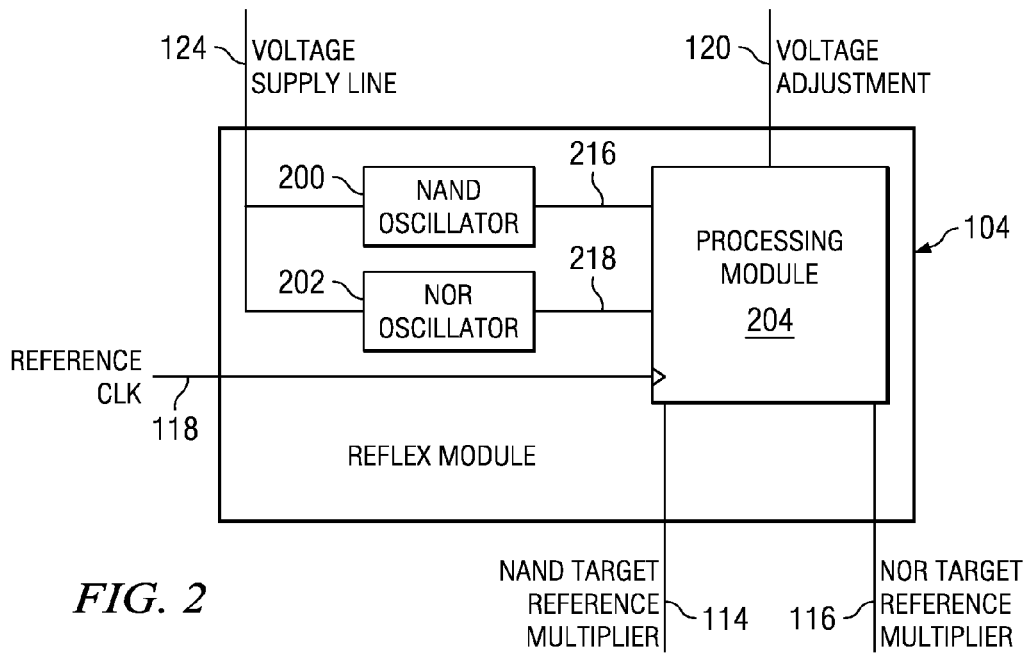
FIG. 2 shows a detailed view of the reflex module of FIG. 1, in accordance with a preferred embodiment of the invention.

FIG. 2 shows an exemplary embodiment of the aforementioned reflex module 104. Specifically, FIG. 2 shows the reflex module 104 comprising, among other things, a NAND oscillator 200, a NOR oscillator 202 and a processing module 204. A NAND oscillator 200 is preferably used because the NAND oscillator is most sensitive to NMOS and less sensitive to PMOS. However, any other suitable logic oscillator, or even any other suitable device capable of performing at least some functions of the NAND oscillator 200 as described below, may be used. The precise function of the NAND oscillator 200 is described in detail below. Likewise, the NOR oscillator 202 is preferably used because the NOR oscillator is most sensitive to PMOS and less sensitive to NMOS. However, any other suitable logic oscillator, or even any other suitable device capable of performing at least some functions of the NOR oscillator 202 as described below, may be used. The precise function of the NOR oscillator 202 is described in detail below. The processing module 204 is supplied with the reference clock signal 118 shown in FIG. 1. The processing module 204 also is supplied with a NAND target reference multiplier (TRM) 114 and a NOR target reference multiplier (TRM) 116, each of which has a function similar to that of the TRM 112 of FIG. 1. Although only two input reference signals 114, 116 are shown, any number of input reference signals may be used.

Figure 3A:
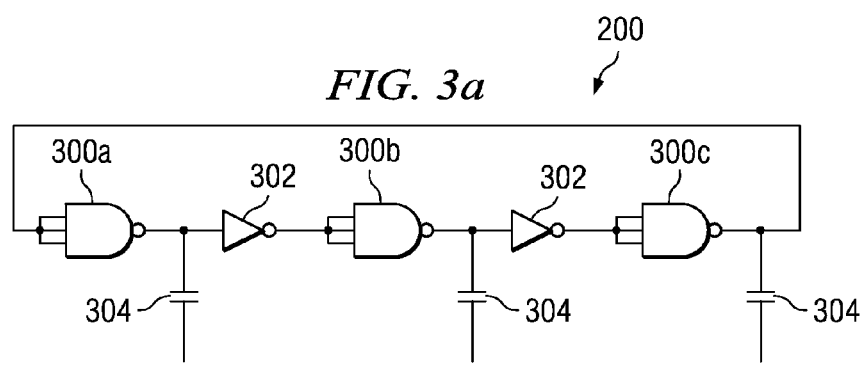
FIG. 3a shows a circuit schematic of a NAND oscillator within the reflex module of FIG. 2, in accordance with a preferred embodiment of the invention.
Figure 3B:
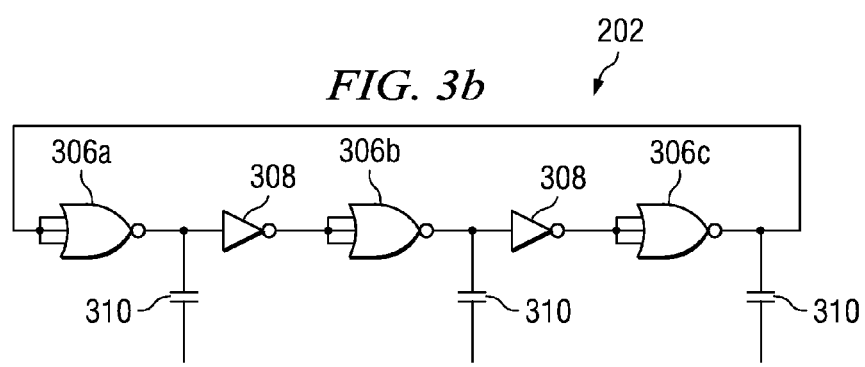
FIG. 3b shows a circuit schematic of a NOR oscillator within the reflex module of FIG. 2, in accordance with a preferred embodiment of the invention.

As shown in FIG. 3a, the NAND oscillator 200 comprises in one embodiment an arrangement of NAND gates 300a-300c, inverters 302, and capacitors 304. The output of the NAND gate 300c is fed back to the input of the NAND gate 300a, thus creating a feedback loop that causes the NAND oscillator 200, when provided a voltage by the voltage source 106, to oscillate at a certain frequency. Although only three NAND gates 300 are shown, any number of NAND gates, inverters, capacitors, and any other suitable circuitry may be used. Similarly, in a preferred embodiment, FIG. 3b shows a NOR oscillator 202 comprising an arrangement of NOR gates 306a-306c, inverters 308, and capacitors 310. The output of the NOR gate 306c is fed back to the input of the NOR gate 306a, thus creating a feedback loop that causes the NOR oscillator 202, when provided a voltage by the voltage source 106, to oscillate at a certain frequency. Although only three NOR gates 306 are shown, any number of NOR gates, inverters, capacitors and any other suitable circuitry may be used. Because the NAND oscillator 200 and the NOR oscillator 202 are not application-specific, they may be considered generic and may be used in any suitable device or circuit architecture. Other circuitry that performs functions similar to those of the oscillator as described below may, in some embodiments, be used instead of one or more of the oscillators. This other circuitry, as well as the oscillators, may generally be referred to as "tracking elements."

As described above, one function of the reflex module 104 is to anticipate how various conditions (e.g., temperature, ripple effects, and others as described above and/or those not specifically set out herein) may affect the speed of the critical path 96 (or any circuit path 98) and to adjust the voltage output of the voltage source 106 accordingly, so as to maintain a predetermined speed of the critical path 96 (or another circuit path 98). The reflex module 104 anticipates such speed changes of the critical path 96 or another circuit path 98 by using the NAND oscillator 200 and the NOR oscillator 202, as described below.

The reflex module 104 preferably is placed in close proximity to the critical path 96 and/or the sub-chip 102 (e.g., within 1 mm, within 5 mm, or any other suitable distance). The reflex module's proximity to the critical path 96 is at least sufficiently close so that the reflex module 104 and the contents thereof are subjected to some or all of the same environmental influences as the critical path 96. For example, an increase in internal temperature or external temperature may affect the critical path 96 and the reflex module 104 equally or at least to a similar degree. The NAND oscillator 200 and the NOR oscillator 202 are used to anticipate speed changes along the critical path 96 under the assumption that under substantially similar environmental conditions, the frequency of the NAND oscillator 200 (which is primarily sensitive to NMOS, meaning that it simulates performance of the NMOS in the critical path 96 under similar performance conditions) and the frequency of the NOR oscillator 202 (which is primarily sensitive to PMOS, meaning that it simulates performance of the PMOS in the critical path 96 under similar conditions) will be indicative of the worst-possible performances of the critical path 96. If other tracking elements are used instead of the oscillators, those tracking elements may simulate the worst-case performance of at least a portion of the critical path 96, given that the critical path 96 and the tracking elements are subjected to substantially similar operating conditions and/or environmental influences.

That is, various aforementioned factors (e.g., temperature) may affect both the NAND and NOR oscillators, but each to a different degree. As such, the NAND and NOR oscillators each can represent the worst-case performance scenarios of the critical path 96, since the NAND oscillator 200 represents the performance of the critical path 96 if the path 96 were comprised of primarily NMOS, and the NOR oscillator 202 represents the performance of the critical path 96 if the path 96 were comprised of primarily PMOS. However, in reality, the critical path 96 is likely to be comprised of both NMOS, PMOS and other circuitry. Thus, the actual speed of the critical path 96 is likely to be greater than the frequencies of the NAND and NOR oscillators 200, 202. Thus, by ensuring that the frequencies of the NAND and NOR oscillators 200, 202 never fall outside a predetermined frequency range, the speed of the critical path 96 will be virtually guaranteed to be within a desired range as well.

Again, more specifically, the critical path 96 may be of any suitable architectural design. However, regardless of the precise design or the quality of the silicon used to fabricate the critical path 96, the speed of the critical path 96 will be greater than that of the NAND oscillator 200 and the NOR oscillator 202. This is because the NAND oscillator 200 is represented by the arrangement of NMOS-sensitive NAND gates shown in FIG. 3a, thus representing one possible worst-case performance scenario. The NOR oscillator 202 is represented by the arrangement of PMOS-sensitive NOR gates shown in FIG. 3b, thus representing the other possible worst-case performance scenario. However, the critical path 96, in most practical cases, may likely be a combination of NMOS, PMOS, and/or other types of circuitry, thus making the critical path 96 less sensitive to environmental influences than the NAND and NOR oscillators 200, 202. As such, the actual performance of the critical path 96 is better than both of the worst-case performance scenarios given by the NAND oscillator 200 and the NOR oscillator 202. Thus, even if the critical path 96 is comprised of NMOS and no PMOS, the performance of the critical path 96 will be accurately predicted by the NAND oscillator 200. Conversely, if the critical path 96 is comprised of PMOS and no NMOS, the performance of critical path 96 will be accurately predicted by the NOR oscillator 202. Regardless of the precise circuitry of the critical path 96, the speed of the critical path 96 will be superior to that of the NAND oscillator 200 and the NOR oscillator 202. The same concepts would apply if other tracking elements were used instead of one or more of the oscillators.

By using the oscillation frequencies of the NAND oscillator 200 and the NOR oscillator 202 to anticipate the worst-case performance of the critical path 96, the reflex module 104 is able to adjust the voltage supplied by the voltage source 106 accordingly and to maintain a steady level of performance for the critical path 96. More specifically, by monitoring and reacting to worst-case performance scenarios for the critical path 96 (i.e., monitoring the NAND and NOR oscillators), the actual speed (i.e., performance) of critical path 96 is likely to be at an acceptable level and may not need to be monitored. For example, if various environmental conditions cause the NAND oscillator 200 to begin to perform poorly (i.e., at a lower-than-necessary frequency), the reflex module 104 may increase the voltage output of the voltage source 106, thus increasing the speed of the critical path 96. In this way, even though the critical path 96 may not yet have been suffering from excessively low speed, the NAND oscillator 200, which was simulating the worst-case speed of the critical path 96, alerted the reflex module 104 to such a possibility. In turn, the reflex module 104 prevented such an occurrence by taking the necessary precaution of increasing voltage output to the critical path 96. Accordingly, a drop in speed of the critical path 96 was avoided.

As previously explained, the reflex module 104 is generic and independent of the sub-chip 102 or the contents thereof. As such, the reflex module 104 surmises or estimates the speed of the critical path 96 using the oscillating frequencies of the NAND and NOR oscillators 200, 202. The reflex module 104 uses the frequencies of the NAND oscillator 200 and the NOR oscillator 202 to adjust output voltage of the voltage source 106 as follows. First, the NAND and NOR TRMs 114, 116 are assigned values and are supplied to the processing module 204. The reference clock signal 118 also is input into the processing module 204. The processing module 204 multiplies the reference clock signal 118 frequency by each of the multipliers 114, 116 to produce NAND and NOR TRFs 115, 117, respectively (not shown). For example, under a given set of environmental influences, if the NAND TRM 114 has a value of 3 and the reference clock signal 118 is set at 32 kHz, then the NAND TRF 115 may be determined to be approximately 96 kHz (i.e., 32 kHz multiplied by 3). The TRF 115 then is compared to the NAND oscillator 200 oscillating frequency to obtain a NAND ratio. If, for example, the NAND oscillator 200 is oscillating at 960 kHz, then the NAND ratio is approximately 10 (i.e., 960 kHz divided by 96 kHz) and the NAND oscillator 200 is said to be oscillating at an excessively high frequency (i.e., the NAND ratio is greater than 1). Similarly, if the NOR TRM 116 is 2, and the reference clock signal 118 is set at 32 kHz, then the NOR TRF 117 is about 64 kHz (i.e., 32 kHz multiplied by 2). The TRF 117 then is compared to the NOR oscillator 202 frequency to obtain a NOR ratio. If, for example, the NOR oscillator 202 is oscillating at 128 kHz, then the NOR ratio is approximately 2 (i.e., 128 kHz divided by 64 kHz) and the NOR oscillator 202 is said to be oscillating at too high a frequency (i.e., the NOR ratio is greater than 1).

Because the performance frequencies of the NAND oscillator 200 and the NOR oscillator 202 are undesirably high, the critical path 96 speed also is higher than required and is wasting power. Accordingly, the processing module 204 may send a signal to the voltage source 106 that causes the voltage source 106 to decrease the voltage that is output by the voltage source 106. Thus, the voltage supplied to the critical path 96 by way of supply lines 122, 126 and to the reflex module 104 by way of supply lines 122, 124 may be decreased. In this way, because the voltage supplied to the critical path 96 (i.e., effectively, transistors within the critical path 96) is decreased, the speed of the critical path 96 also is decreased, thereby correcting or preventing an excessively high speed. Also, the decrease in voltage supplied to the reflex module 104 by way of supply lines 122, 124 may cause the NAND oscillator 200 and NOR oscillator 202 oscillating frequencies to fall, thus satisfying frequency ratio expectations (i.e., causing the ratios to be approximately 1 or within a predetermined range that includes 1). The reflex module 104 then may continue to monitor the aforementioned ratios to maintain a predetermined target speed for the critical path 96 and/or other circuit paths 98.

Another example of the operation of the reflex module 104 is as follows. If the reference clock signal 118 is 40 MHz, the NAND TRM 114 is 4, and the NOR TRM 116 is 2.5, then the NAND TRF 115 is 160 MHz (i.e., 40 MHz multiplied by 4) and the NOR TRF 117 is 100 MHz (i.e., 40 MHz multiplied by 2.5). Furthermore, if the NAND oscillator 200 is oscillating at 120 MHz, and the NOR oscillator 202 is oscillating at 80 MHz, then the NAND and NOR ratios may be approximately 0.75 (i.e., 120 MHz divided by 160 MHz) and 0.8 (i.e., 80 MHz divided by 100 MHz), respectively. In this case, the NAND and NOR oscillators are oscillating at an excessively low frequency (i.e., ratios are less than 1). Such a slow oscillation frequency indicates that the critical path 96 may also be performing at an excessively low speed, or may soon be performing at an excessively low speed. To eliminate or avoid this problem, the reflex module 104 may cause the voltage source 106 to increase the voltage that is transferred to critical path 96, thus increasing the speed of the critical path 96 to an acceptable level (e.g., until the processing module 204 determines that the NAND and NOR ratios are about 1 or within a predetermined range including 1).

Because the NAND TRM 114 and the NOR TRM 116 are variable, they can be used to manipulate the performance of the critical path 96. For example, the critical path 96 may have a certain speed. Any suitable entity (e.g., a human user, a computer program, a circuit switch) may adjust the TRM 114 and/or the TRM 116 to select a different reference multiplier, thus indirectly altering the TRFs 115, 117. For example, one or both of the TRMs 114, 116 may be raised to a level such that the corresponding TRFs 115,117 are raised above the oscillating frequency of the NAND and NOR oscillator 200, 202. Because the NAND and NOR oscillators 200, 202 will be recognized by the processing module 204 as oscillating at too low a frequency (in comparison to the TRFs 115, 117), the processing module 204 will cause the voltage source 106 to increase its voltage output, thereby increasing the speed of the critical path 96. This same technique may be used to cause the critical path 96 to perform at a lower speed and save power. As previously mentioned, although only two target reference multipliers 114, 116 are shown at the processing module 204, any number of target signals may be used.

Figure 4:
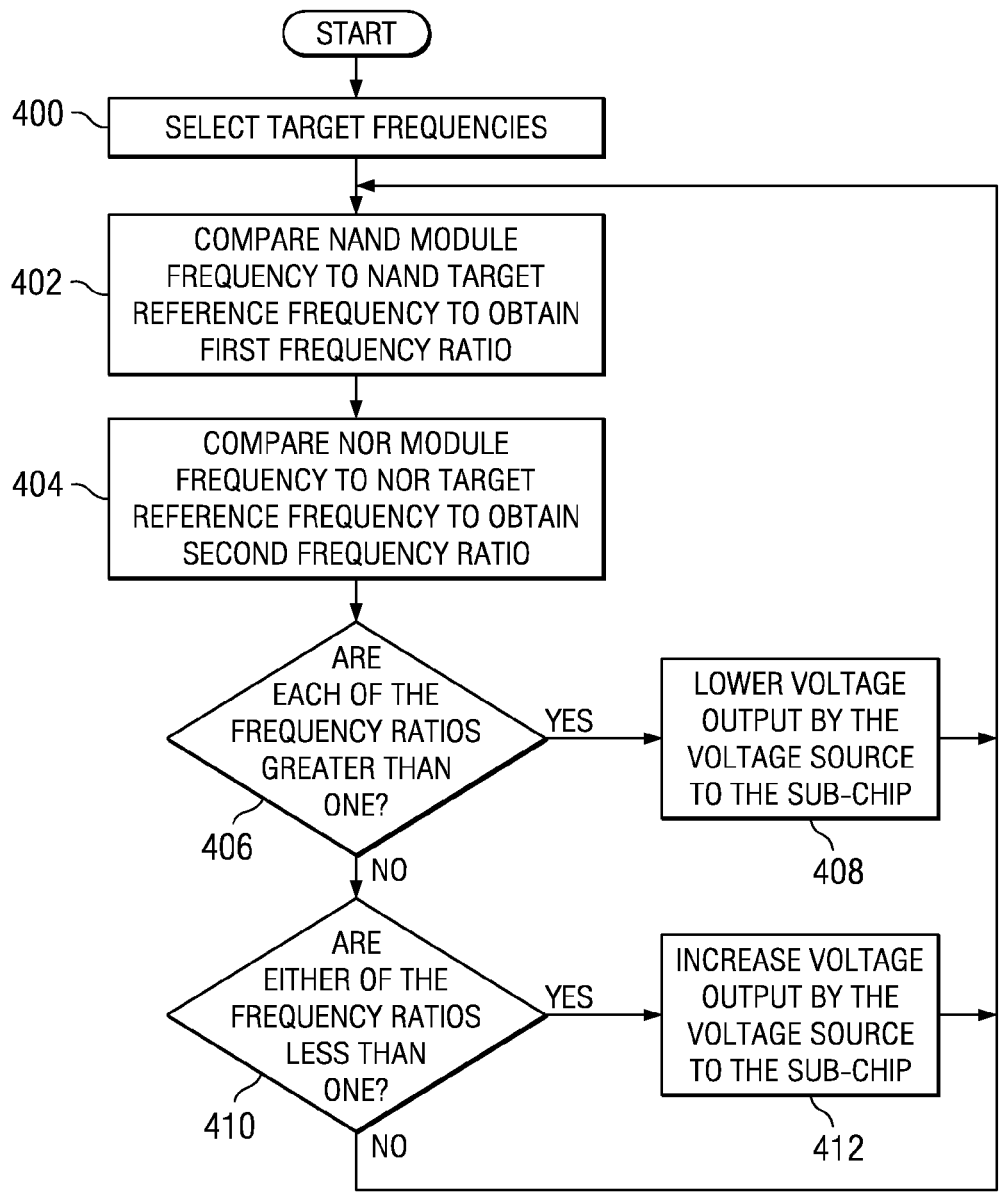
FIG. 4 shows a flow diagram describing the process used by the reflex module of FIG. 2 to adaptively adjust the voltage that is output by a voltage source to a sub-chip, in accordance with a preferred embodiment of the invention.

FIG. 4 shows a flow diagram describing the frequency comparison and voltage regulation process explained above. The process may begin by selecting desired target frequencies (block 400). This step involves receiving two target reference multipliers and multiplying them by the reference clock frequency to produce the target frequencies. The processing module 204 then may compare the oscillation frequency of the NAND oscillator 200 to the NAND target frequency to obtain a first frequency ratio (block 402), thus establishing one worst-case scenario. The processing module 204 also may compare the oscillation frequency of the NOR oscillator 202 to the NOR target frequency to obtain a second frequency ratio (block 404), thus establishing the other possible worst-case scenario. The processing module 204 then may determine whether each of the first and second frequency ratios is greater than approximately 1 (block 406). Although a comparison to 1 is preferred, values other than 1 also may be used. If both ratios are greater than approximately 1, then the voltage source output is reduced (block 408) and control returns to the block 402. However, if both ratios are not greater than approximately 1, then the processing module 204 determines if either of the first and second frequency ratios is less than approximately 1 (block 410). If either ratio is less than approximately 1, then the voltage output of the voltage source is increased (block 412) and control returns to block 402. Otherwise, if either of the frequency ratios is not less than approximately 1, then control is directly returned to block 402. In this way, the worst-case performance scenarios of the critical path 96 are constantly monitored, thereby ensuring that the actual speed of the critical path 96 matches the desired speed. The scope of disclosure is not limited to these particular steps, nor is the scope of disclosure limited to performing these steps in the order shown.

The above discussion is meant to be illustrative of the principles and various embodiments of the present invention. Numerous variations and modifications will become apparent to those skilled in the art once the above disclosure is fully appreciated. For example, as previously discussed, although the above embodiments are described in context of a NAND/NOR oscillator system, other tracking elements that reflect the performance of an associated circuit path or critical path may be substituted for the NAND and NOR oscillators. In some embodiments, more than two tracking elements may be used. For example, different tracking elements may be used to surmise the performance of NMOS, PMOS, Hi-$V_t$ PMOS, Lo-$V_t$ PMOS, Hi-$V_t$ NMOS and Lo-$V_t$ NMOS components. In at least some embodiments, the tracking elements may be designed to be substantially sensitive to variations in process, voltage and temperature, thus ensuring that the tracking elements embody the worst-case performance scenarios for critical paths associated with the tracking elements. Also, although the embodiments above are discussed in terms of oscillators, oscillating frequencies and target frequencies, other tracking elements and other performance parameters besides frequency also may be used. It is intended that the following claims be interpreted to embrace all such variations and modifications.

What is claimed is:

1. A device for adaptively controlling a supply voltage output supplied to circuitry in substantially close proximity to the device, comprising:
    a processing module;
    a first tracking element coupled to the processing module and producing a first value indicative of a first estimated speed associated with the circuitry; and
    a second tracking element coupled to the processing module and producing a second value indicative of a second estimated speed associated with the circuitry;
    wherein the processing module compares each of the first and second values to respective target values and adjusts the supply voltage output based on said comparisons;
    wherein at least one of the first and second tracking elements comprises an oscillator.

2. The device of claim 1, wherein at least one of the first and second tracking elements is located substantially adjacent to the circuitry that receives the adjusted supply voltage output.

3. The device of claim 1, wherein at least one of the first, second and target values is a frequency value.

4. The device of claim 1, wherein at least one of the first and second tracking elements is subjected to substantially similar operating conditions as the circuitry.

5. The device of claim 1, wherein at least one of the tracking elements is selected from a group consisting of NAND oscillators and NOR oscillators.

6. The device of claim 1, wherein the adjusted supply voltage output is output by a voltage source coupled to the circuitry.

7. The device of claim 1, wherein the processing module compares each of the first and second values to the target values to produce first and second value ratios.

8. The device of claim 1, wherein the circuitry comprises components selected from a group consisting of NMOS components, PMOS components, Hi-Vt PMOS components, Lo-Vt PMOS components, Hi-Vt NMOS components and Lo-Vt NMOS components.

9. The device of claim 1, wherein the speed of the circuitry is manipulated by adjusting at least one of the target values.

10. The device of claim 1, wherein each of the tracking elements is selected from a group consisting of NMOS-sensitive oscillators, PMOS-sensitive oscillators, Hi-Vt PMOS-sensitive oscillators, Lo-Vt PMOS-sensitive oscillators, Hi-Vt NMOS-sensitive oscillators and Lo-Vt NMOS-sensitive oscillators.

11. The device of claim 1, wherein at least one of the tracking elements is more sensitive to environmental conditions than is the circuitry.

12. The device of claim 1, wherein the first tracking element is more sensitive to NMOS and the second tracking element is more sensitive to PMOS.

13. The device of claim 12, wherein the circuitry comprises a critical path circuit and the critical path circuit comprises both NMOS and PMOS.

14. The device of claim 1, wherein the processing module adjusts the supply voltage output to reduce power consumption.

15. The device of claim 1, wherein the circuitry comprises a critical path circuit, and the device is operable to reduce the supply voltage output if the critical circuit path is performing too fast relative to one of said target values or increase the supply voltage output if the critical circuit path is performing too slow relative to another one of said target values.

16. A chip, comprising:
    a circuit comprising a plurality of circuit paths and receiving a supply voltage output from a voltage source; and
    a module external to the circuit, coupled to the voltage source, and comprising a first tracking element and a second tracking element, said module subjected to substantially similar operating conditions as the circuit;
    wherein the module adjusts said supply voltage output based on a value generated by at least one of the first and second tracking elements;
    wherein at least one of the first and second tracking elements comprises an oscillator.

17. The chip of claim 16, wherein the module adjusts the supply voltage output by comparing a target value with the value of at least one of the first and second tracking elements.

18. The chip of claim 17, wherein the module generates the target value by multiplying a predetermined target value multiplier by a reference value.

19. The chip of claim 17, wherein a speed of the circuit is manipulated by adjusting the target value.

20. The chip of claim 16, wherein at least one of the tracking elements comprises a plurality of NAND gates and does not comprise NOR gates.

21. The chip of claim 16, wherein at least one of the tracking elements comprises a plurality of NOR gates and does not comprise NAND gates.

22. The chip of claim 16, wherein the module maintains a predetermined circuit speed.

23. The chip of claim 16, wherein the module maintains a predetermined value for at least one of the first and second tracking elements.

24. The chip of claim 16, wherein the value is a frequency.

25. The chip of claim 16, wherein at least one of the tracking elements is more sensitive to environmental conditions than is the circuit.

26. The chip of claim 16, wherein the first tracking element is more sensitive to NMOS and the second tracking element is more sensitive to PMOS.

27. A method, comprising:
    determining a first frequency ratio of a first tracking element frequency to a first target reference frequency;
    determining a second frequency ratio of a second tracking element frequency to a second target reference frequency; and
    based on said frequency ratios, adjusting a supply voltage that is output by a voltage source to a circuit associated with tracking elements having the first and second tracking element frequencies;
    wherein at least one of said tracking elements comprises an oscillator.

28. The method of claim 27, wherein adjusting the supply voltage comprises:
    if each of the frequency ratios is greater than approximately one, lowering the supply voltage that is output by the voltage source to the circuit; and
    if either of the frequency ratios is less than approximately one, increasing the supply voltage that is output by the voltage source to said circuit.

29. The method of claim 27, wherein said circuit is on a first chip that is separate from a second chip comprising the tracking elements.

30. The method of claim 27, wherein adjusting the supply voltage comprises manipulating at least one of the target reference frequencies.

31. The method of claim 27, wherein adjusting the supply voltage comprises using the minimum required voltage needed to achieve or maintain at least one of the target reference frequencies.

32. The method of claim 27, wherein the at least one of said tracking elements is more sensitive to an environmental condition than is the circuit.

33. The method of claim 27, further comprising steps of reducing the supply voltage output if the circuit is performing too fast relative to one of said target reference frequencies or increasing the supply voltage output if the circuit is performing too slow relative to another one of said target reference frequencies.

34. A system, comprising:
a processing module;
a voltage source coupled to the processing module; and
a plurality of tracking elements coupled to the processing module and the voltage source and associated with circuitry separate from the tracking elements, a separate value is generated by each tracking element, wherein each value is indicative of a respective performance speed of at least a portion of the circuitry;
wherein the processing module adjusts a supply voltage output of the voltage source based on a comparison of the value of at least one of said tracking elements to its desired value;
wherein at least one of said plurality of tracking elements comprises an oscillator.

35. The system of claim 34, wherein at least one of the tracking elements is more sensitive to environmental influences than is the circuitry.

36. The system of claim 34, wherein the circuitry comprises components selected from a group consisting of NMOS, PMOS, Hi-Vt PMOS, Lo-Vt PMOS, Hi-Vt NMOS and Lo-Vt NMOS.

37. The system of claim 34, wherein the speed of at least the portion of the circuitry is manipulated by adjusting the desired value.

38. The system of claim 34, wherein the desired value and the value generated by each tracking element are frequency values.

* * * * *